United States Patent
Yilmaz et al.

(10) Patent No.: US 7,122,406 B1
(45) Date of Patent: Oct. 17, 2006

(54) SEMICONDUCTOR DEVICE PACKAGE DIEPAD HAVING FEATURES FORMED BY ELECTROPLATING

(75) Inventors: Hamza Yilmaz, Saratoga, CA (US); Anthony Chia, Singapore (SG); Seishi Fujimaki, Shanghai (CN); Xiaoguang Zeng, Shanghai (CN)

(73) Assignee: GEM Services, Inc., Santa Clara, CA (US)

( * ) Notice: Subject to any disclaimer, the term of this patent is extended or adjusted under 35 U.S.C. 154(b) by 194 days.

(21) Appl. No.: 10/751,265

(22) Filed: Jan. 2, 2004

(51) Int. Cl.
H01L 21/44 (2006.01)
H01L 21/48 (2006.01)
H01L 21/50 (2006.01)

(52) U.S. Cl. ............ 438/123; 438/124; 438/127; 438/725

(58) Field of Classification Search ........ 438/123, 438/124, 725, 127
See application file for complete search history.

(56) References Cited

U.S. PATENT DOCUMENTS

| | | |
|---|---|---|
| 5,172,214 A | 12/1992 | Casto |
| 6,143,981 A | 11/2000 | Glenn |
| 6,355,502 B1 | 3/2002 | Kang et al. |
| 6,420,779 B1 | 7/2002 | Sharma et al. |
| 6,437,429 B1 | 8/2002 | Su et al. |
| 6,476,478 B1 | 11/2002 | Swiss et al. |
| 6,583,499 B1 | 6/2003 | Huang et al. |
| 6,630,728 B1 | 10/2003 | Glenn |

OTHER PUBLICATIONS

Duffek et al., "Etching in Printed Circuit Handbook", Chapter 6 C.F. Coombs, Ed. (McGraw-Hill, New York, 1967).
ORBIS Technologies, Ltd., Drilling & De-Smearing Flexible Printed Circuits, http://www.orbitech.col.uk/appst01.html, printed Aug. 17, 2004.
SIGMA, Etching Process, http://www.sigma-mecer.com/chem..html, printed Aug. 17, 2004.

*Primary Examiner*—Thien F. Tran
(74) *Attorney, Agent, or Firm*—Townsend and Townsend and Crew LLP

(57) ABSTRACT

Embodiments in accordance with the present invention relate to the fabrication of packages for semiconductor devices, and in particular to the use of electroplating techniques to form features on the surface of a metal lead frame. In accordance with one embodiment, electroplating is used to fabricate non-integral pin portions shaped to remain securely encapsulated within the plastic molding of the package. In accordance with another embodiment, electroplating may be used to fabricate protrusions on the underside of the lead frame for elevating the package above the PC board, thereby preserving the rounded shape of solder balls used to secure the diepad to the PC board. In accordance with yet another embodiment, electroplating may be used to fabricate raised patterns on the upper surface of the diepad for ensuring uniform spreading of adhesive used to secure the die to the diepad, thereby ensuring level attitude of the die within the package.

10 Claims, 18 Drawing Sheets

SEMICONDUCTOR DEVICE PACKAGE DIEPAD HAVING FEATURES FORMED BY ELECTROPLATING

BACKGROUND OF THE INVENTION

FIG. 1A shows an underside plan view of a conventional quad flat no-lead (QFN) package utilized to house a semiconductor device. FIG. 1B shows a cross-sectional view taken along line B-B', of the conventional QFN package of FIG. 1A, positioned on a PC board.

QFN package 100 comprises semiconductor die 102 having electrically active structures fabricated thereon. Die 102 is affixed to underlying diepad 104a portion of lead frame 104 by adhesive 106. The relative thickness of the die and lead frame shown in FIG. 1B, and all other drawings of this patent application, is not to scale. Lead frame 104 also comprises non-integral pin portions 104b in electrical communication with die 102 through bond wires 108. Bond wires 108 also allow electrical communication between die 102 and diepad 104a.

Plastic molding 109 encapsulates all but the exposed portions 104a' and 104b' of the lead frame portions 104a and 104b, respectively. For the purposes of this patent application, the term "encapsulation" refers to partial or total enveloping of an element in a surrounding material, typically the metal of the lead frame within a surrounding dielectric material such as plastic.

Portions of the upper surface of lead frame 104 bear silver Ag 105 formed by electroplating. The lower surface of lead frame 104 bears a layer of Pd/Ni or Au/Ni 107 formed by electroplating.

QFN package 100 is secured to traces 110 of underlying PC board 112 by solder 114 that preferably has the rounded shape indicated. The electrically conducting properties of solder 114 allows electrical signals to pass between lead frame portions 104a and 104b and the underlying traces 110.

FIG. 1C shows a plan view of only the lead-frame 104 of QFN package 100 of FIGS. 1A–B. Lead frame 104 is typically formed by etching a pattern of holes completely through a uniform sheet of copper. FIG. 1D shows one example of such a pattern of holes 116 in a copper roll 118. These patterns of holes define a proto-lend frame 122 comprising proto-diepad 124 and proto-non-integral portions 126. Proto-diepad 124 is secured to the surrounding metal frame by tie bars 120. Proto-non-integral pin portions 126 are secured to the surrounding metal frame by tabs 128.

The patterned metal portion shown in FIG. 1D is processed into a package by gluing a die to the diepad, and connecting bond wires between the die and non-integral portions and/or the diepad. While the diepad and non-integral portions are still attached to the surrounding metal, the bond wires and a portion of the diepad and non-integral lead frame portions are encapsulated within a dielectric material such as plastic. Fabrication of an individual package is then completed by severing the tabs and tie bars to singulate an individual package from its surrounding metal frame and other packages associated therewith.

While adequate for many purposes, the conventional QFN package just described offers some drawbacks. One drawback is the difficulty of forming raised features on the lead frame.

For example, FIG. 1B shows that non-integral lead frame pin portions 104b exhibit a thinned region 104b'' proximate to the diepad. Thinned pin region 104b'' is surrounded on three sides by the plastic encapsulant 109 of the package body, thereby physically securing non-integral pin portion 104b within the package.

Moreover, FIG. 1B also shows that diepad portions 104a exhibit a thinned region 104a'' proximate to the non-integral pins. Thinned diepad region 104a'' is surrounded on three sides by the plastic encapsulant of the package body, thereby physically securing the diepad within the package.

FIGS. 1E–1H show cross-sectional views of the conventional process steps for fabricating a lead frame having a thinned portion. In FIG. 1E, the inverted Cu sheet 118 is electroplated on its bottom surface with an Au/Pd/Ni combination or an Ag/Ni combination to form layer 107. For the Au/Pd/Ni combination, the Au is between about 0.01–0.015 µm in thickness, the Pd is between about 0.02–0.2 µm in thickness, and the Ni is between about 0.5–2.5 µm in thickness. For an Ag/Ni electroplated coating, Ag and Ni are each between about 0.5–2.5 µm in thickness.

In FIG. 1F, photoresist mask 150 is patterned over layer 107 to expose the regions 152 that are to be thinned. Exposed regions 152 are then exposed to an etchant for a controlled period, which removes Cu material to a predetermined depth Y.

In FIG. 1G, the photoresist mask is removed, and Cu roll 118 is then reoriented right side up. The upper surface of the Cu roll 118 is then selectively electroplated to form silver layer 105. The silver may be electroplated only in specific regions over the substrate utilizing a mask (not shown) during this step.

In FIG. 1H, the backside of partially-etched Cu sheet 118 is patterned with a photoresist mask 119 leaving exposed areas 121 corresponding to the thinned regions. The partially-etched Cu sheet 118 is then etched completely through in the exposed areas 121 to form a pattern of holes 116 separating diepad 104a from non-integral pins 104b.

Fabrication of the QFN package is subsequently completed by affixing the die to the diepad, attaching bond wires between the die and diepad and non-integral pin portions, and then enclosing the structure within plastic encapsulation, as is well known in the art.

The etching stage of the QFN package fabrication process shown in FIG. 1F is relatively difficult to control with precision. Specifically, the accuracy of etching the Cu lead frame in small areas is about 20–25% of the total lead frame thickness. This is due to inability to rapidly and reproducibly halt the progress of chemical etching reaction once it is initiated. Etching outside the above tolerance range can result in the scrapping of many lead frames, elevating package cost.

Moreover, the conventional approach of partial etching to shape thinned features limits the pitch of the lead, and thus the number of pins available for a given QFN package body size. This limitation in lead pitch results from the at least partially isotropic character of the etching process, which removes material in the lateral, as well as vertical, direction.

Therefore, there is a need in the art for improved techniques for fabricating semiconductor device packages.

BRIEF SUMMARY OF THE INVENTION

Embodiments in accordance with the present invention relate to the use of electroplating techniques to form features on the surface of a metal lead frame used in the packaging of semiconductor devices. In accordance with one embodiment, electroplating is used to fabricate portions of the diepad and of the non-integral pins that are shaped to remain securely encapsulated within the plastic molding of the package. In accordance with another embodiment, electroplating may be used to fabricate protrusions on a package underside which elevate it above the surface of the PC board, thereby preserving the rounded shape of solder balls used to secure the diepad to the PC board. In accordance with yet another embodiment, electroplating may be used to fabricate raised patterns on the upper surface of the diepad for ensuring uniform spreading of adhesive used to secure the die to the diepad, thereby ensuring level attitude of the die within the package.

An embodiment of a method in accordance with the present invention for fabricating a lead frame for a semiconductor device package, comprises, providing a first metal layer and patterning a mask over the first metal layer to reveal exposed regions. A metal is electroplated in the exposed regions, the mask is removed, and at least a portion of the first metal layer and the electroplated metal are encapsulated within a dielectric material.

An alternative embodiment of a method in accordance with the present invention for fabricating a lead frame for a semiconductor device package, comprises, providing a first layer, and patterning a first mask over the first layer to reveal first exposed regions. A first metal is electroplated over the first layer in the first exposed regions. A second mask is patterned over the first mask to reveal second exposed regions, and a second metal is electroplated over the first mask in the second exposed regions. The first and second masks are removed, and at least a portion of the first metal and the second metal are encapsulated within dielectric material.

Another alternative embodiment of a method in accordance with the present invention for fabricating a metal lead frame, comprises, patterning a negative photoresist mask over a substrate, and electroplating raised portions of a copper lead frame within regions exposed by the negative photoresist mask. A positive photoresist mask is patterned over the negative photoresist mask and the raised copper portions. Diepad and pin portions of the copper lead frame are electroplated within regions exposed by the positive photoresist mask. The negative and positive photoresist masks are removed, and a die is attached to the diepad. The die and lead frame are encapsulated within plastic, and the raised copper portions and the plastic are separated from the substrate.

An embodiment of a lead frame in accordance with the present invention for a semiconductor device package, comprises, a diepad comprising a metal, and a pin separate from the diepad. An electroplated raised feature comprising the metal is formed on at least one of the diepad and the pin.

These and other embodiments of the present invention, as well as its features and some potential advantages are described in more detail in conjunction with the text below and attached figures.

BRIEF DESCRIPTION OF THE DRAWINGS

FIGS. 3AA–EA show plan views of the method of FIGS. 3A–E.

FIGS. 5AA–FA show plan views of the process steps shown in FIGS. 5A–F.

DETAILED DESCRIPTION OF THE INVENTION

Figure 1A:
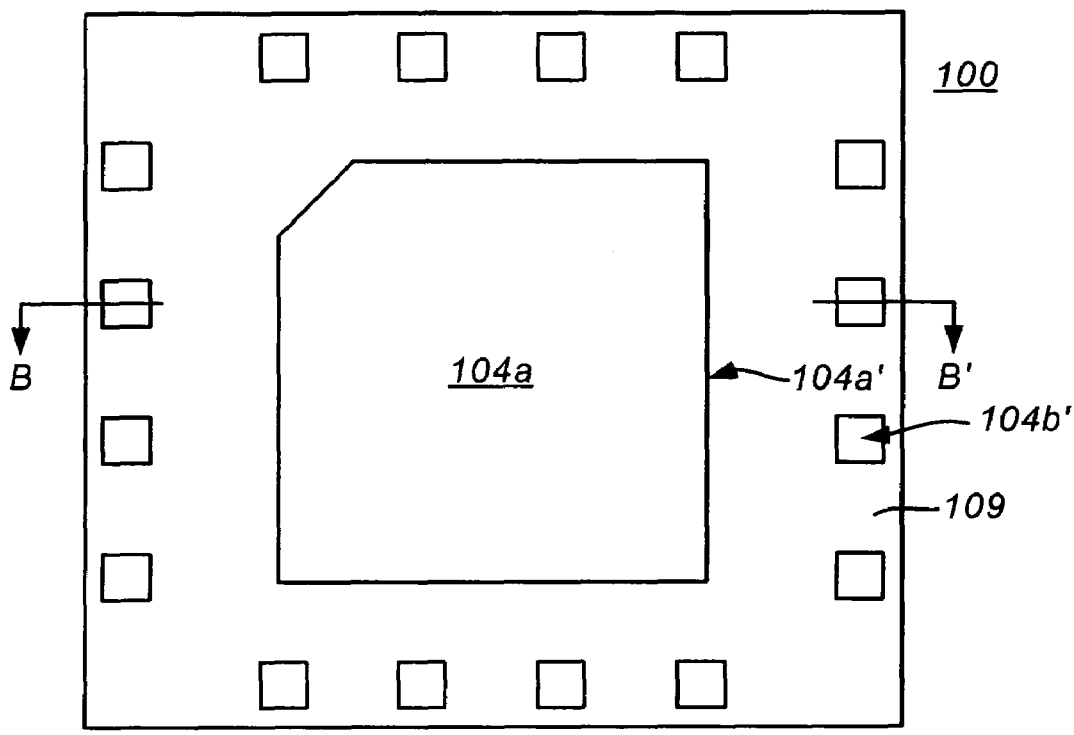
FIG. 1A shows an underside plan view of a conventional QFN package.
Figure 1B:
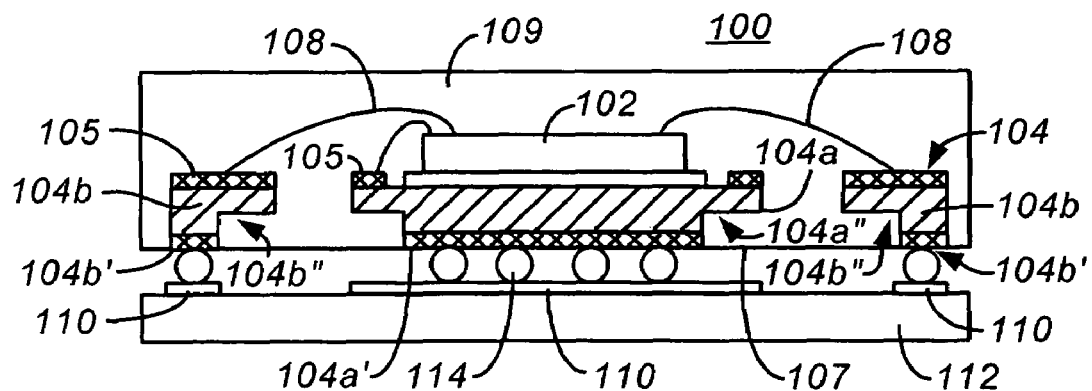
FIG. 1B shows a cross-sectional view of the package of FIG. 1A taken along line B-B'.
Figure 1C:
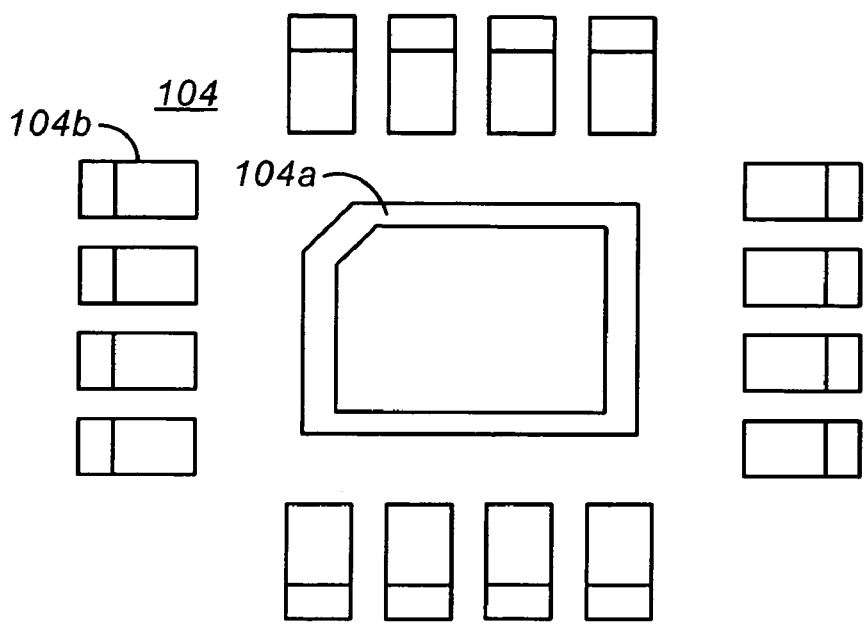
FIG. 1C shows a plan view of the lead frame only, of the conventional package of FIGS. 1A–B.
Figure 1D:
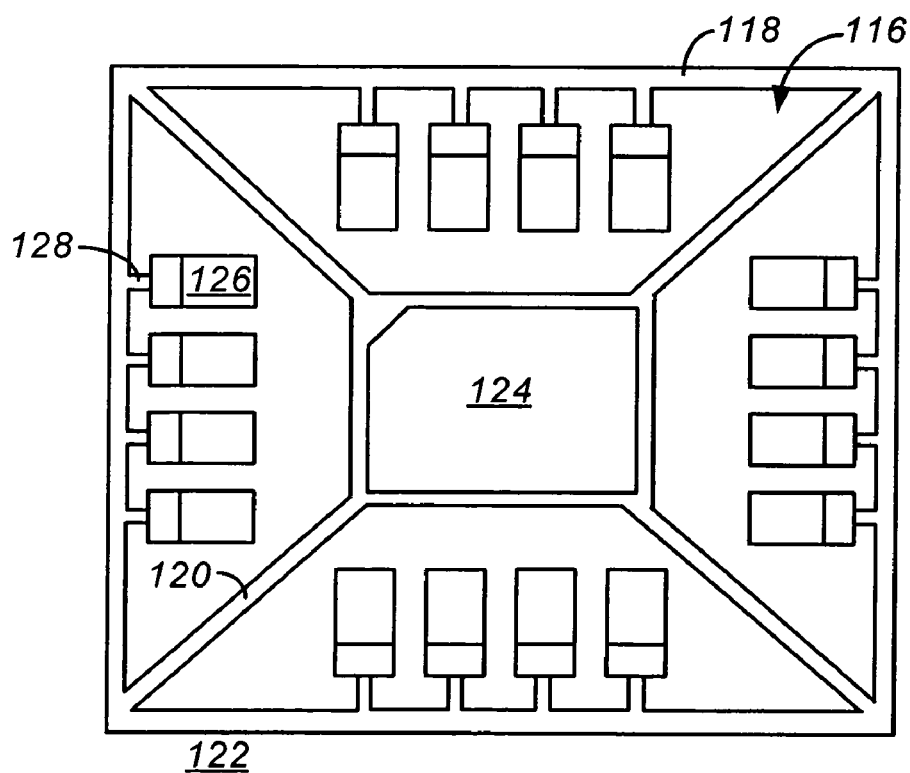
FIG. 1D shows a plan view of a copper alloy metal sheet bearing a pattern of holes as is used to fabricate the package of FIGS. 1A–B.
Figure 1E:
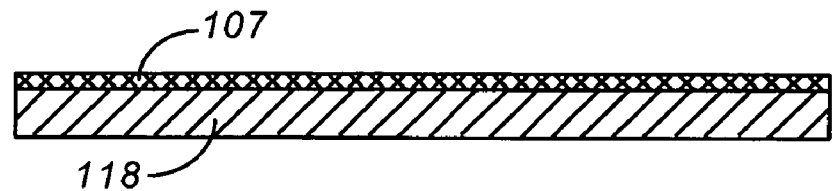
FIGS. 1E–1H show cross-sectional views of specific steps for fabricating the lead frame of FIG. 1C.
Figure 1F:
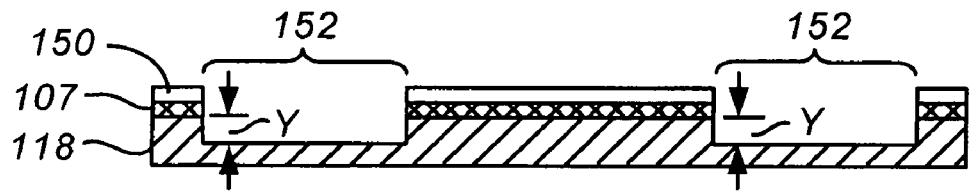
Figure 1G:
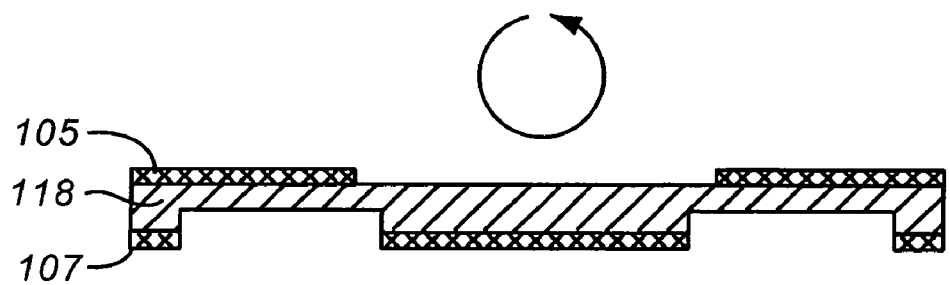
Figure 1H:
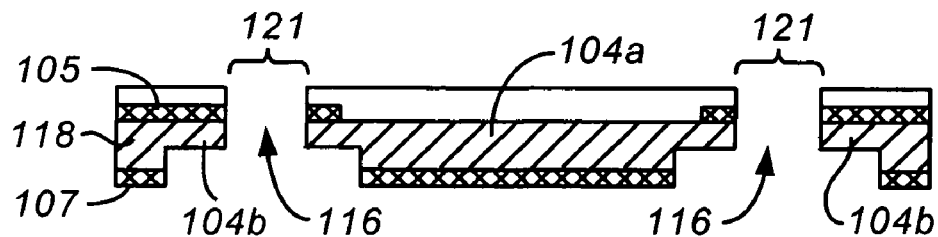
Figure 2:
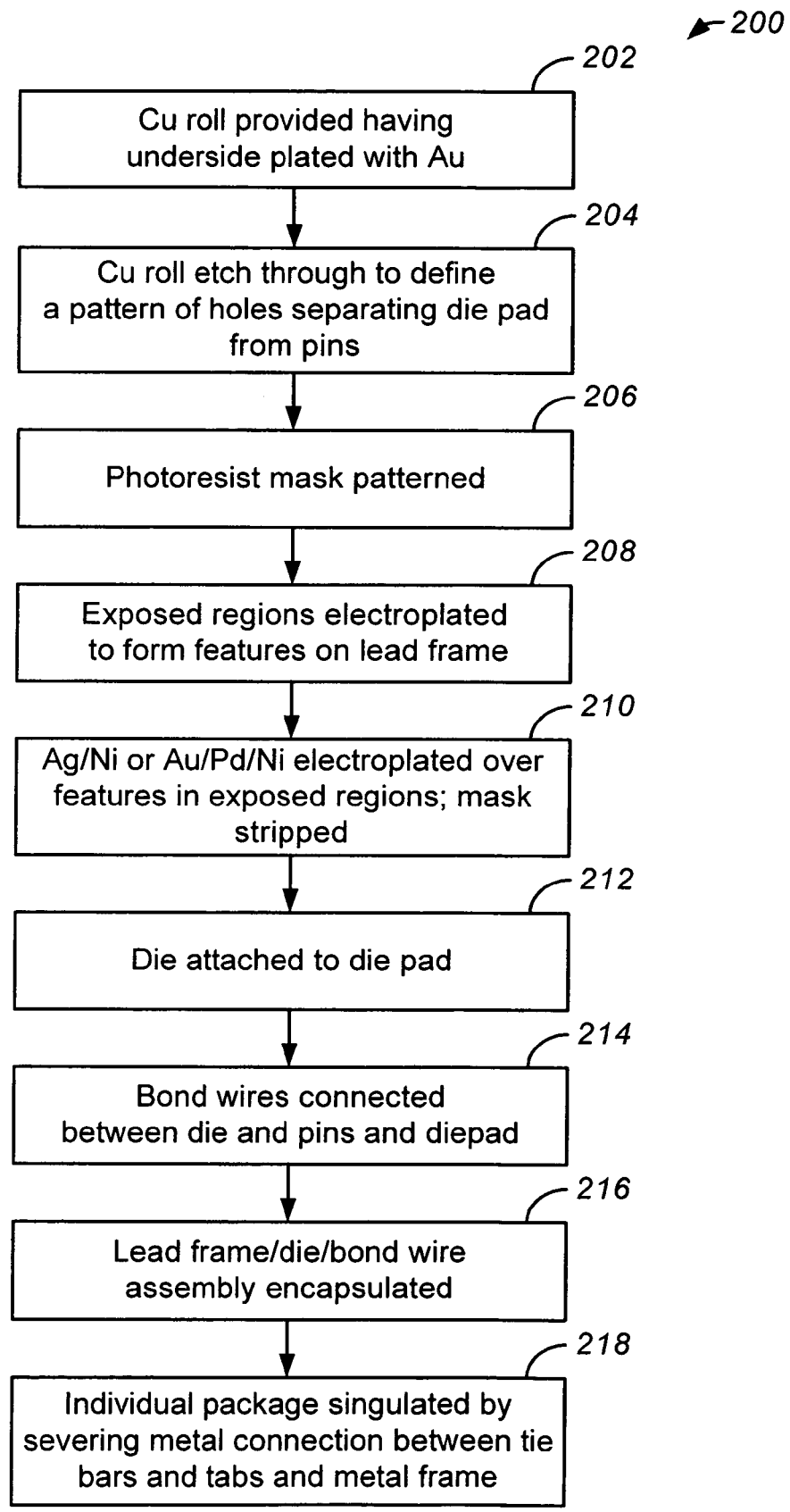
FIG. 2 shows a flow chart of steps of an embodiment of a process in accordance with the present invention for fabricating a QFN package.
Figure 3A:
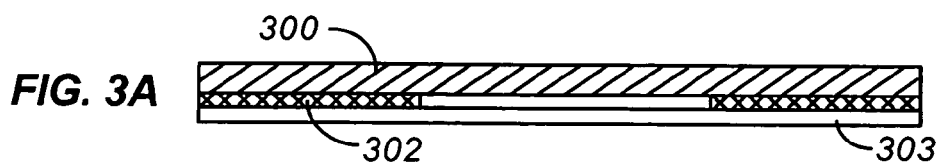
FIGS. 3A–E show cross-sectional views of the process for fabricating a QFN package shown in FIG. 2.
Figure 3A:
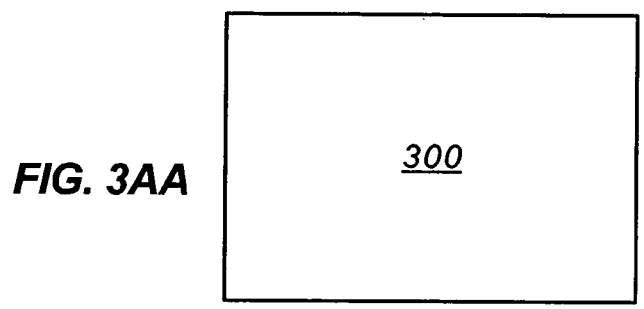

Embodiments in accordance with the present invention relate to the fabrication of packages for semiconductor devices, and in particular to the use of electroplating techniques to form features on the surface of a metal lead frame. In accordance with one embodiment, electroplating is used to fabricate non-integral pin portions shaped to remain securely encapsulated within the plastic molding of the package. In accordance with another embodiment, electroplating may be used to fabricate protrusions on the underside of the lead frame for elevating the package above the PC board, thereby preserving the rounded shape of solder balls used to secure the diepad to the PC board. In accordance with yet another embodiment, electroplating may be used to fabricate raised patterns on the upper surface of the diepad for ensuring uniform spreading of adhesive used to secure the die to the diepad, thereby ensuring level attitude of the die within the package FIG. 2 shows a flow chart of the processing steps for fabricating a QFN package in accordance with one embodiment of the present invention. FIGS. 3A–E show cross-sectional views of the processing steps shown in FIG. 2. FIGS. 3AA–3EA show plan views of the processing steps shown in FIGS. 3A–E, respectively.

In first step 202 of process 200 illustrated in FIGS. 3A and 3AA, Cu roll 300 having a thickness of about 4 mils is provided. The lower surface of Cu roll 300 bears a selectively electroplated layer 302 comprising Ni (0.5–3.0 μm) and Ag (0.5–3.0 μm), or comprising Ni (0.5–3.0 μm)/Pd (~0.15 μm)/Au (0.015 μm). This layer 302 is supported and protected/covered by adhesive tape 303.

Figure 3B:
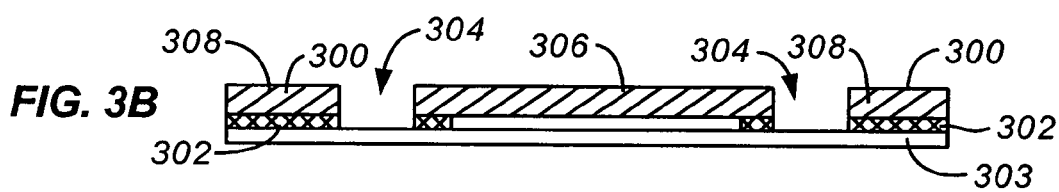
Figure 3B:
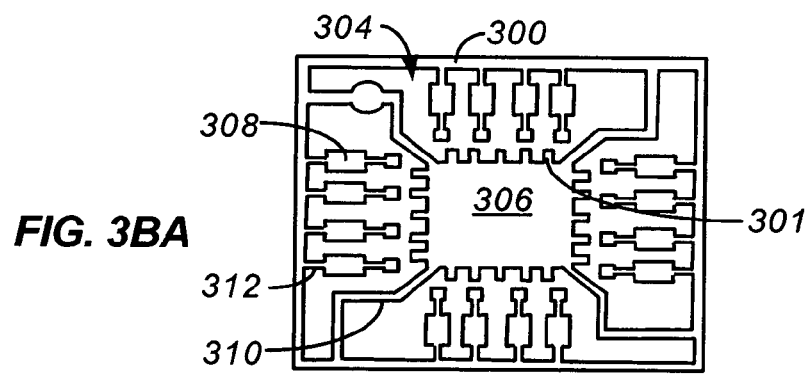

In step 204 illustrated in FIGS. 3B–BA, the electroplated Cu roll 300 is etched completely through to define a pattern of holes 304 separating diepad 306 from non-integral pins 308. The corresponding plan view shown in FIG. 3BA also shows the definition of tie bars 310 and tabs 312 securing diepad 306 and non-integral pins 308, respectively, to surrounding Cu roll 300 during this step.

FIG. 3BA also shows that diepad 306 formed during this step features a periphery 301 exhibiting a serpentine shape. Projections of this serpentine shape 301 serve to lock the diepad into the plastic mold to maintain package integrity under a range of temperature and moisture conditions.

Figure 3C:
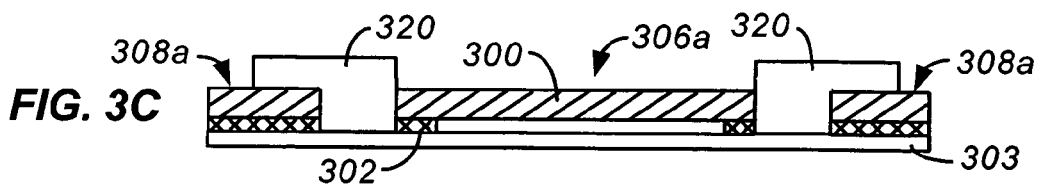
Figure 3C:
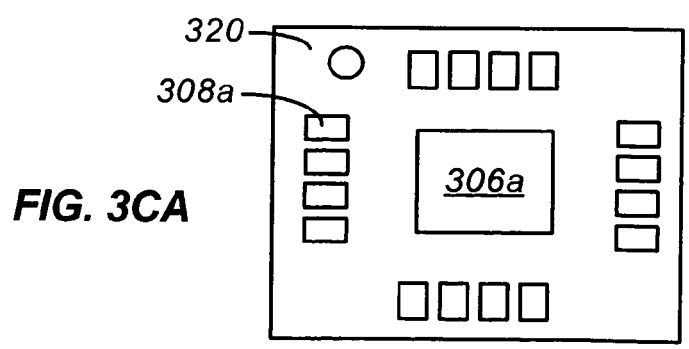

In step 206 illustrated in FIGS. 3C–CA, mask 320 of photoresist is patterned to reveal lead-post pin regions 308a and diepad regions 306a desired to have additional thickness.

Figure 3D:
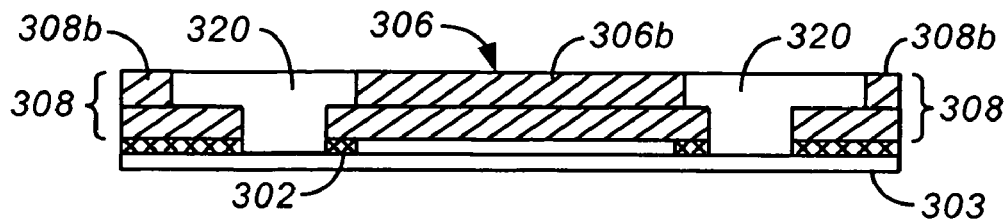
Figure 3D:
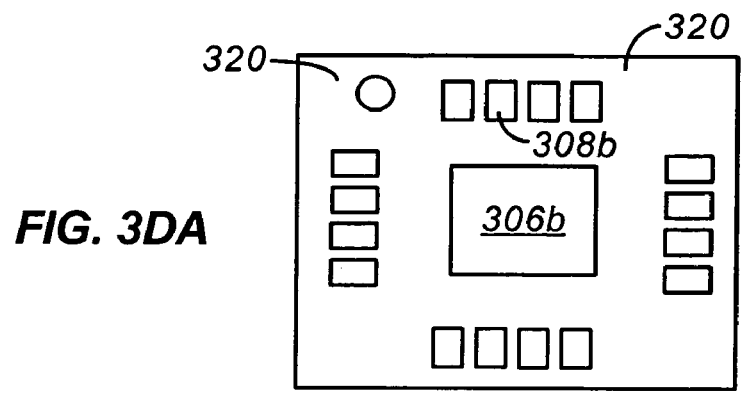

In step 208, illustrated in FIGS. 3D–DA, the exposed regions 306a and 308a are subjected to electroplating conditions to form thickened lead-posts 308b and diepad 306b out of copper material. In accordance with one embodiment of the present invention, Cu material having approximately the same thickness as the original roll may be added during this step by electroplating.

Figure 3E:
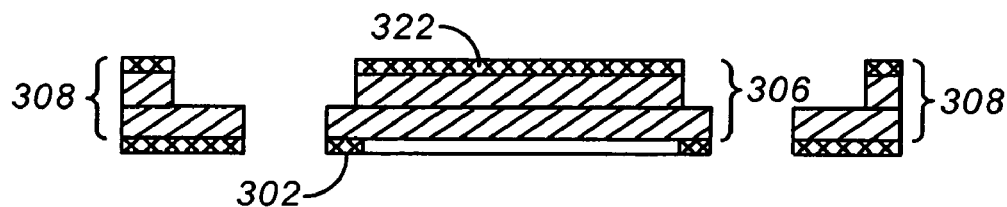
Figure 3E:
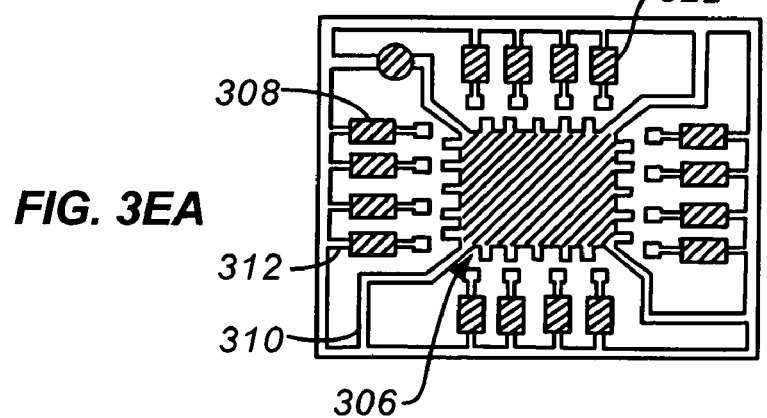

In step 210 illustrated in FIGS. 3E–EA, layer 322 comprising Ag/Ni or Au/Pd/Ni is electroplated onto exposed surfaces of lead-post 308 and diepad 306. The mask is then stripped, to reveal electroplated diepad 306 and pins 308 secured to the surrounding Cu roll 300 by tie bars 310 and tabs 312, respectively.

In steps 212, 214, and 216 of FIG. 2, fabrication of the package is completed by inverting the structure, removing the tape, attaching the die to the diepad, connecting bond wires between the die and pins, and encapsulating the entire lead frame/die/bond wire assembly within a molded plastic material. In step 218 of FIG. 2, the individual package is then singulated from the surrounding metal frame by physically sawing through the bars and tabs.

In the first embodiment shown in FIGS. 3A–EA, regions of additional thickness of the lead frame corresponding to the exposed lead-posts and diepad are formed by the addition of Cu material. Specifically, a layer of Cu material of precise thickness may be deposited by electroplating over the Cu roll under carefully controlled conditions. The precision of this electroplating process is +1 μm or less. This precision may be compared with conventional etch processes, which exhibit a precision of +25 μm for a Cu substrate having an overall thickness of 4–5 mils. The superior precision of electroplating processes over etching processes may be attributed to the ability to quickly halt electrochemical addition of material reaction by changing the electrical potential.

The embodiment of the present invention shown in FIGS. 2, and 3A–EA offer a number of advantages. One advantage is relative similarity to the conventional package fabrication process. Specifically, fabrication is accomplished in part by initially etching a pattern of holes completely through an underlying Cu roll. This similarity allows similar machinery to be used in fabricating the package, facilitating implementation of the new process flow and reducing the die free package cost (DFAC) in the short term.

However, one potential drawback of the process flow shown in FIGS. 2 and 3A–EA, is the continued need to separate the encapsulated package from the surrounding metal frame by physically sawing through the tie bar and tab structures. This singulation by severing of metal connections by sawing is relatively slow and unreliable.

Figure 4:
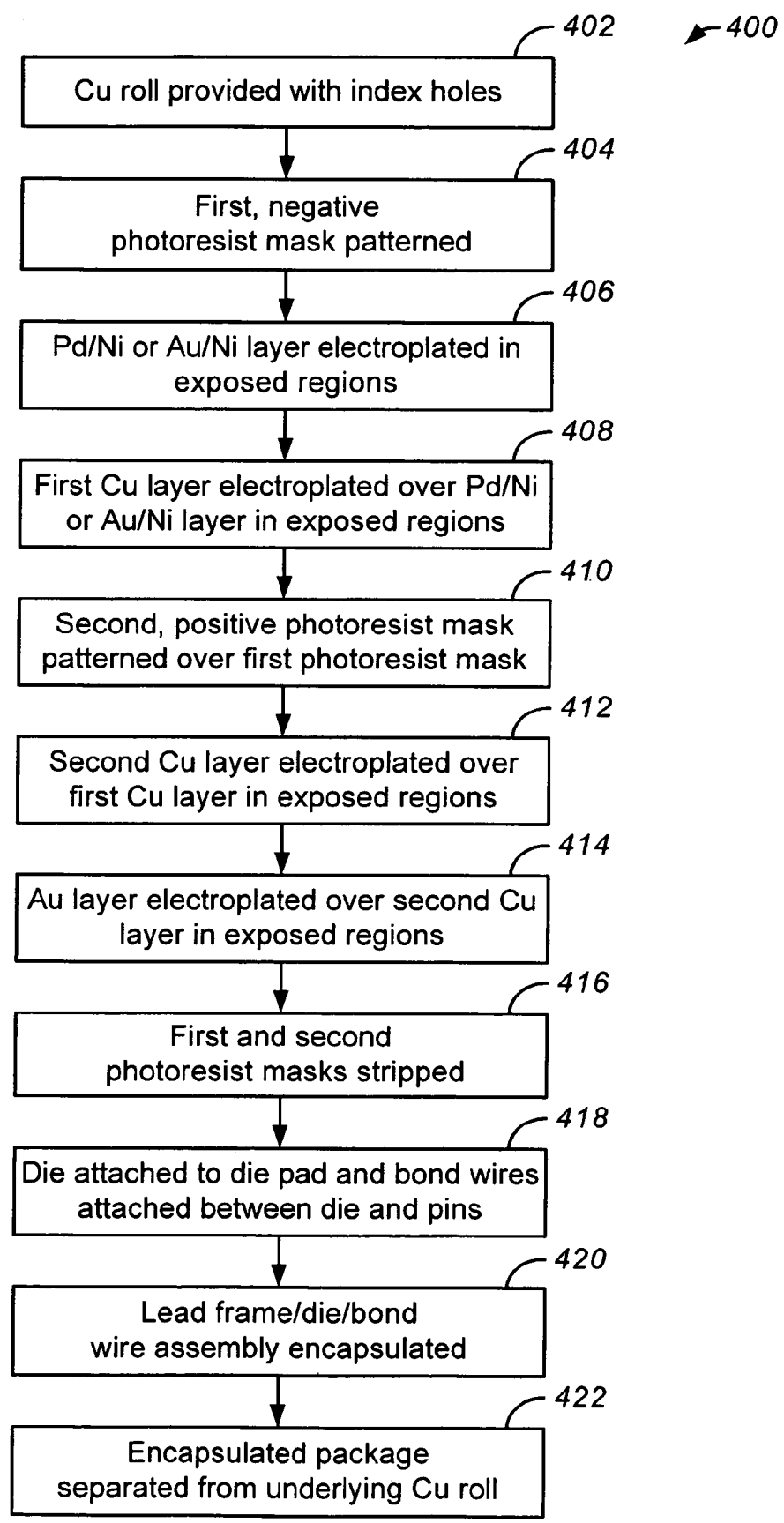
FIG. 4 shows a flow chart of steps of an alternative embodiment of the process in accordance with the present invention for fabricating a QFN package.

Accordingly, FIG. 4 shows a flow chart of a series of steps, and FIGS. 5A–K show cross-sectional and plan views of certain steps, for an alternative embodiment of a process in accordance with the present invention for fabricating a QFN package.

Figure 5A:
FIGS. 5A–J show cross-sectional views of the fabrication process shown in FIG. 4.
Figure 5A:
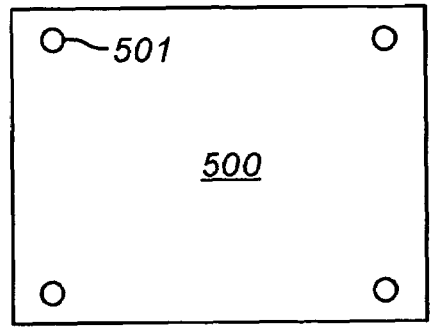

In first step 402 of process 400 illustrated in FIGS. 5A–AA, a Cu roll 500 having a thickness of about 4 mils is provided. Cu roll 500 may include index holes 501 to indicate positioning.

Figure 5B:
Figure 5B:
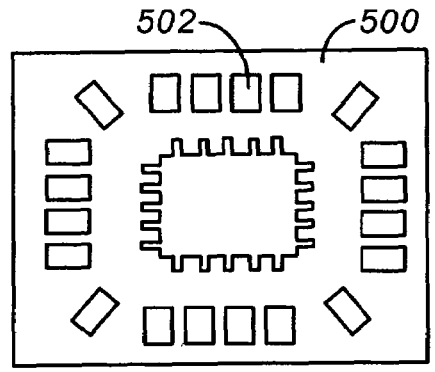

In second step 404, as illustrated in FIGS. 5B–BA, mask 502 comprising negative photoresist material having a thickness of about 100 μm is patterned over Cu roll 500. Openings in this first photoresist mask define the location of lead frame portions of reduced thickness.

Figure 5C:
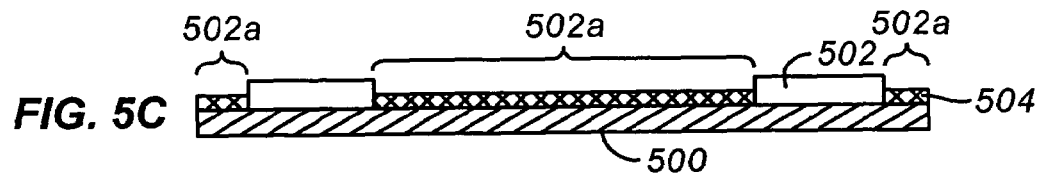
Figure 5C:
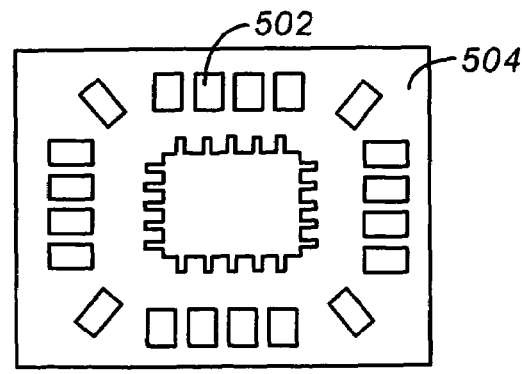

In step 406, as illustrated in FIGS. 5C–CA, the Cu roll is cleaned, and layer 504 comprising Au/Pd/Ni (total thickness ~2.5–3 μm) or Ag/Ni (total thickness 4.5–5.5 μm) is formed by electroplating in regions 502a exposed by mask 502.

Figure 5D:
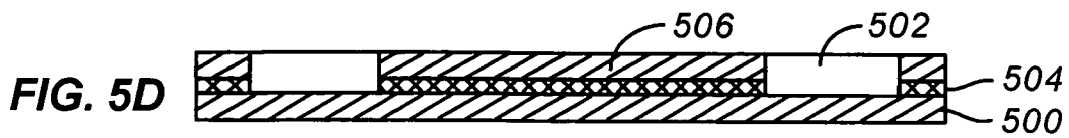
Figure 5D:
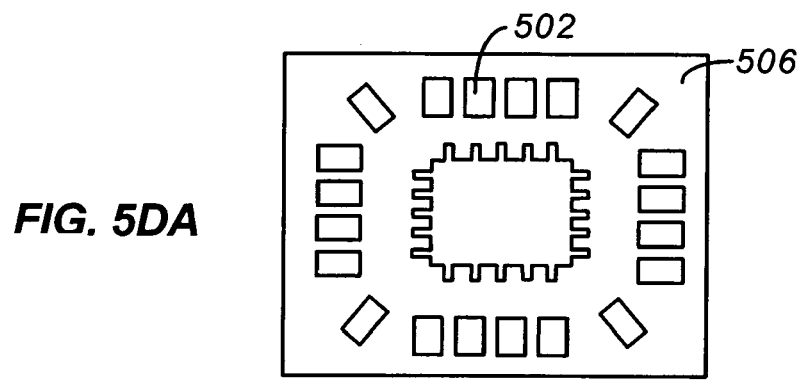

In step 408 as illustrated in FIGS. 5D–DA, with patterned negative photoresist mask 502 still in place, Cu material 506 is having a thickness of about 100 μm is formed over Au/Pd/Ni or Ag/Ni layer 504 in exposed regions by electroplating. Cu material 506 formed during this step comprises the portions of the non-integral lead frame that will remain exposed following encapsulation.

Figure 5E:
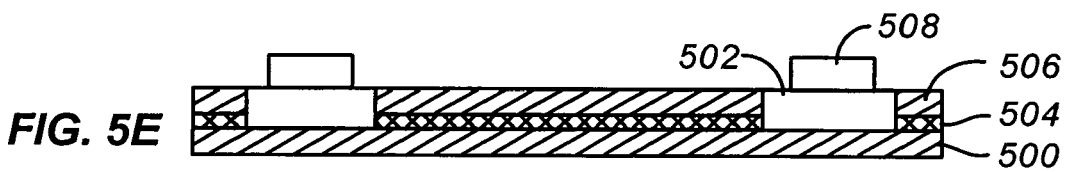
Figure 5E:
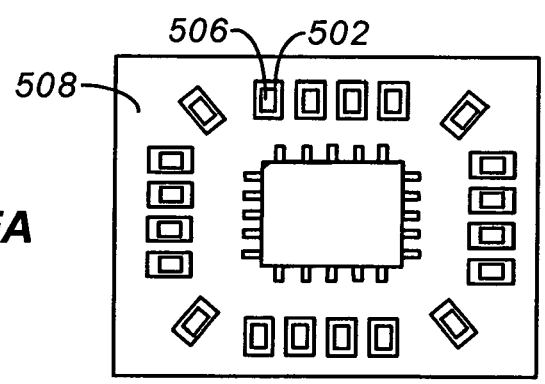

In step 410 as illustrated in FIGS. 5E–EA, positive photoresist mask 508 also having a thickness of about 100 μm is patterned over existing negative photoresist mask 504. The area of regions exposed by positive photoresist mask 508 is larger than the area of regions exposed by first mask. The use of photoresist material of opposite polarity to form the successive masks 504 and 508 is necessitated by the need to develop the second mask without altering the shape of the existing first mask.

Figure 5F:
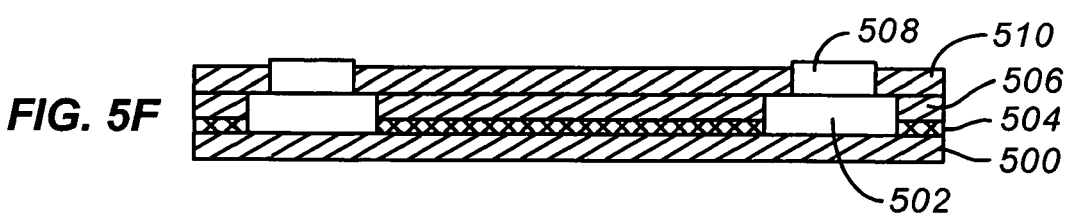
Figure 5F:
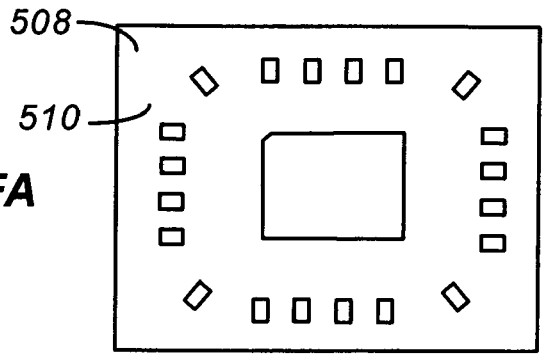

In step 412 as illustrated in FIGS. 5F–FA, a second Cu layer 510 having a thickness of about 100 μm is then deposited in regions exposed by the second negative mask 508. The Cu material formed during this step comprises the bulk, thick portion of the diepad and non-integral lead portions of the resulting package. Portions of the second deposited Cu layer will form over the underlying positive photoresist through a lateral outgrowth from adjacent copper.

Figure 5G:
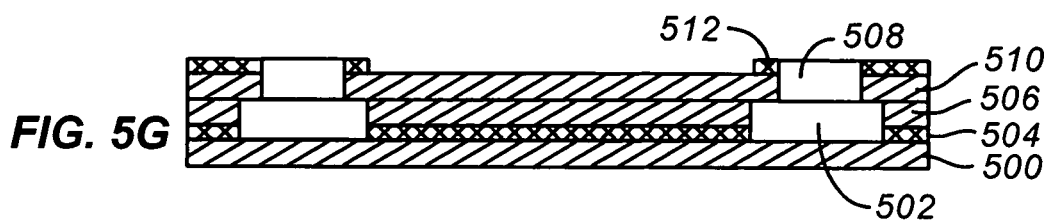

In step 414 illustrated in FIG. 5G, an Ag layer 512 is deposited by electroplating over the second Cu layer 510 in regions exposed by the second photoresist mask. This selective deposition to form Ag can utilize a mask (not shown).

Figure 5H:
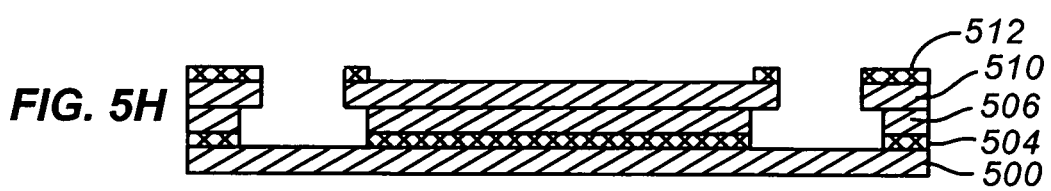

In step 416 illustrated in FIG. 5H, the first and second patterned photoresist masks are stripped. At this stage in the fabrication process, and in contrast with the conventional QFN fabrication approach and with the first embodiment, the diepad and non-integral lead portions are not secured to a surrounding metal frame by tabs or tie bars. Rather, these components are secured in place by contact with the underlying Cu roll substrate.

Owing to this absence of the tie bars, the lead frame of this second embodiment includes four additional pins. These additional pins are located in regions formerly occupied by the tie bars.

Figure 5I:
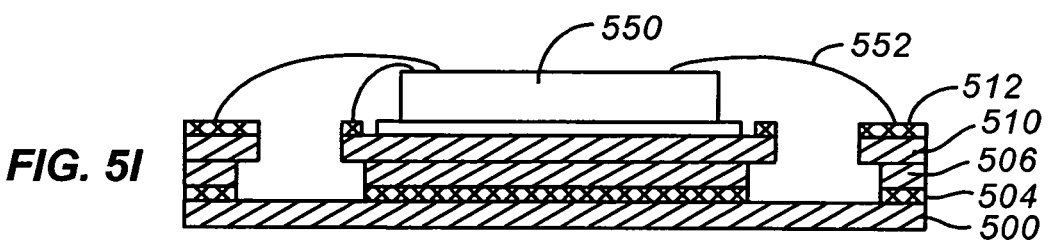
Figure 5J:
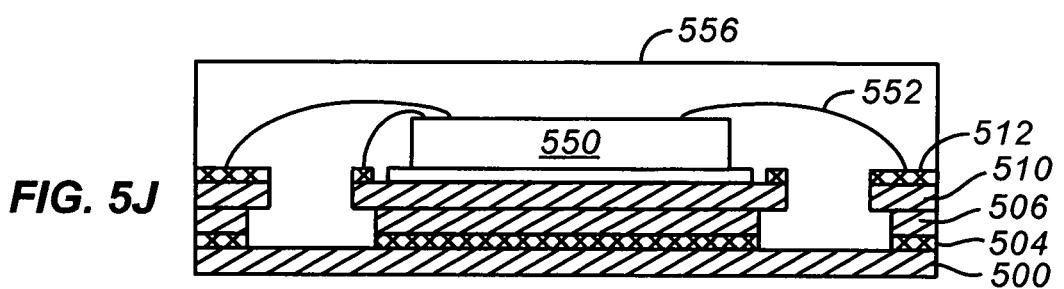

In step 418 illustrated in FIG. 5I, die 550 is attached to the diepad portion with electrically conducting adhesive, and bond wires 552 are connected between die 550 and the pins. In step 420 illustrated in FIG. 5J, the die/lead frame combination is encapsulated in plastic material 556 while still being supported by the Cu roll 500.

Figure 5K:
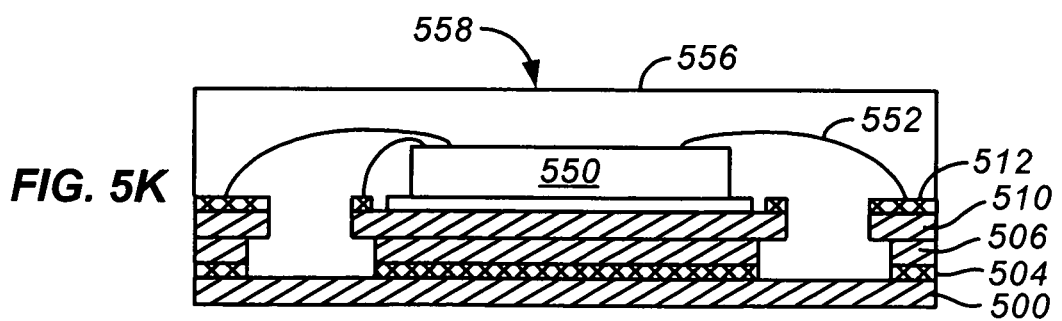

In step 422 illustrated in FIG. 5K, an array of packages within the encapsulant are separated from the underlying Cu support roll by selective chemical etching. A number of Cu etching techniques are known in the art. One approach involves exposure to aqueous $FeCl_3$, and is described in detail by Duffek and Armstrong, "Etching in Printed Circuit Handbook"—Chapter 6, C. F. Coombs, Ed. (McGraw-Hill, New York, 1967). Another approach involves exposure to a known Cu electroplating solution, reversing the electroplating process to remove Cu. This latter approach is described by Parthasaradhy, "Practical Electroplating Handbook (Prentice Hall, Englewood Cliffs, N.J., 1989). Both of the above-cited references are incorporated by reference herein for all purposes.

After the separation step of FIG. 5K, individual QFN packages are singulated from the array by sawing through the mold only. The softness of the plastic encapsulant as compared with the metal, allows the singulation process to occur more easily and with fewer defects.

Moreover, in accordance with still other embodiments of the present invention, mold for the plastic encapsulant may be designed such that each QFN is individually molded within discrete cavities or cells of the mold, with the QFN units held together by contact with the common substrate carrier roll. Using such a specially designed mold, the individual QFN packages could be singulated entirely by chemical exposure, without any need for physical separation by sawing. This approach may reduce lead frame density by including a honeycomb of walls defining cells within the mold, but would avoid the difficult sawing step.

The embodiment shown in FIGS. 4 and 5A–5K offers the advantage of not requiring sawing or otherwise physically severing connections between copper pieces to singulate individual packages. Rather, this package singulation process takes place by way of chemical exposure. The efficiency of this chemical-singulation process reduces the DFPC in the long term. The QFN process flow given in FIG. 4 also allows strip testing of the packages, because the removal of the packages from the substrate by chemical activity results in separation of the leads.

While some of the embodiments of the present invention have been described herein, it should be understood that these are presented by way of example only, and these descriptions are not intended to limit the scope of this invention.

For example, while the specific embodiment for forming a QFN package illustrated in FIGS. 4 and 5A–K utilize a copper roll as the underlying substrate upon which features of the lead frame are successively electroplated, this is not required. In still other alternate embodiments in accordance with the present invention, lead frame features could be formed by successive electrodeposition steps performed on substrates other than copper, for example steel.

Figure 6:
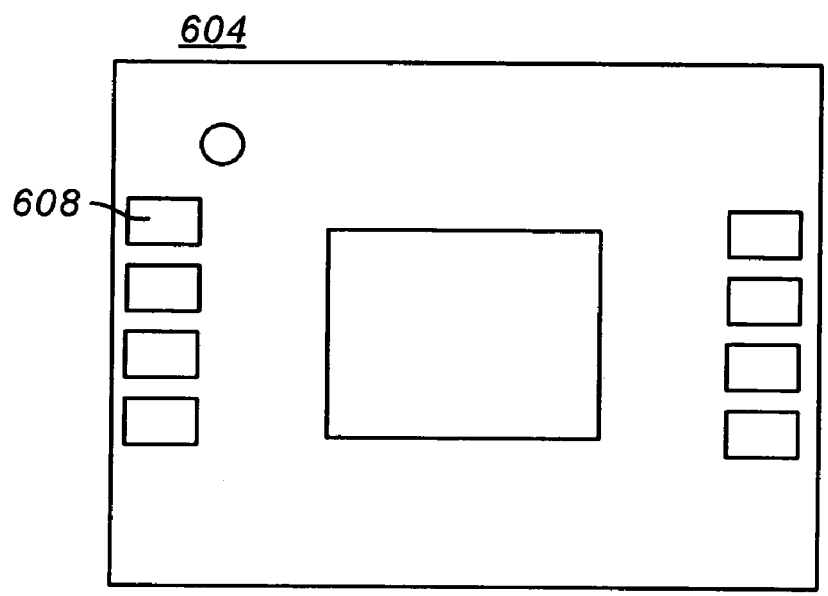
FIG. 6 shows an underside plan view of an alternative embodiment of a package fabricated in accordance with the present invention.

While the previous discussion has focused upon fabrication of a particular type of QFN package, embodiments in accordance with the present invention are not limited to fabricating any specific package. For example, the present invention does not require fabrication of a package having any particular number of pins. FIG. 6 shows a plan view of another alternative embodiment of a QFN package 604 having a lead frame fabricated in accordance with the present invention with only eight pins 608.

Figure 10A:
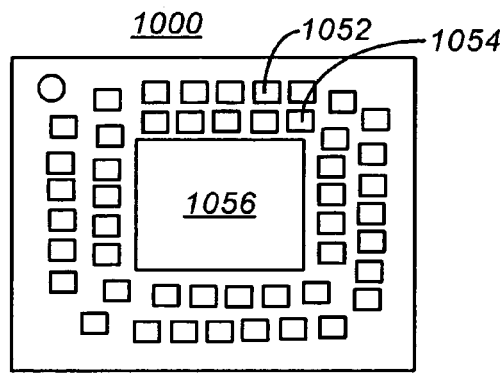
FIG. 10A shows an underside plan view of one embodiment of a package fabricated in accordance with the present invention.
Figure 10B:
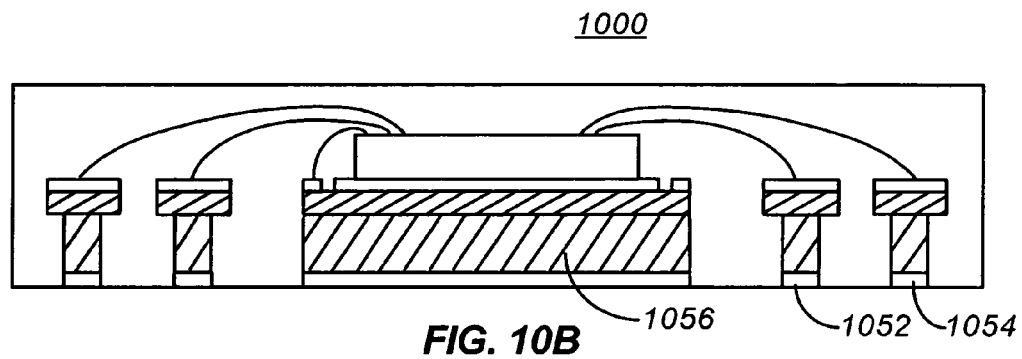
FIG. 10B shows a corresponding cross-sectional view of the package of FIG. 10A featuring pins of uniform height.

And while the previous discussion has focused upon QFN packages having a single bank of non-integral pins adjacent to the diepad, the present invention is not limited to this particular configuration. FIG. 10A shows a plan view of the underside of QFN package 1050 having an inner bank 1052 and an outer bank 1054 of exposed pin structures 1056. FIG. 10B shows a corresponding simplified cross-sectional view of one embodiment of the package shown in FIG. 10A, featuring pins banks 1052 and 1054 having the same height.

Figure 10C:
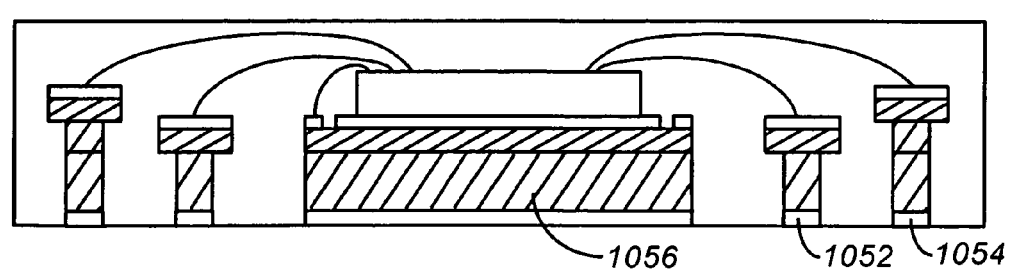
FIG. 10C shows a corresponding cross-sectional view of the package of FIG. 10A featuring taller pins at the outer edge of the package.

FIG. 10C shows a cross-sectional view of an alternative embodiment of the package of FIG. 10A. Package 1000 shown in FIG. 10C features outer bank 1054 comprising pins at the outer edge of the package that are taller than the pins of the inner bank 1052. The different height of pin banks of the specific package shown in FIG. 10C aids in preventing physical interference between bond wires connecting the pins with the central die. The package of FIG. 10C could be fabricated by electroplating in accordance with embodiments of the present invention utilizing more than two masks. The particular embodiment shown in FIG. 10C also enables wire-bonding to replace Ball Grid Array (BGA) with an interposer structure, in packages featuring a medium pin count, reducing package cost.

Furthermore, in packages having a high pin count, the exposure of the diepad on the underside of the package may be undesirable. In such package designs where exposure of the lead frame is to be avoided, the conventional fabrication approach involves partial etching of the diepad to reduce its thickness. Such a partial etching step, however, suffers from the lack of precision and additional expense described above.

Figure 7:
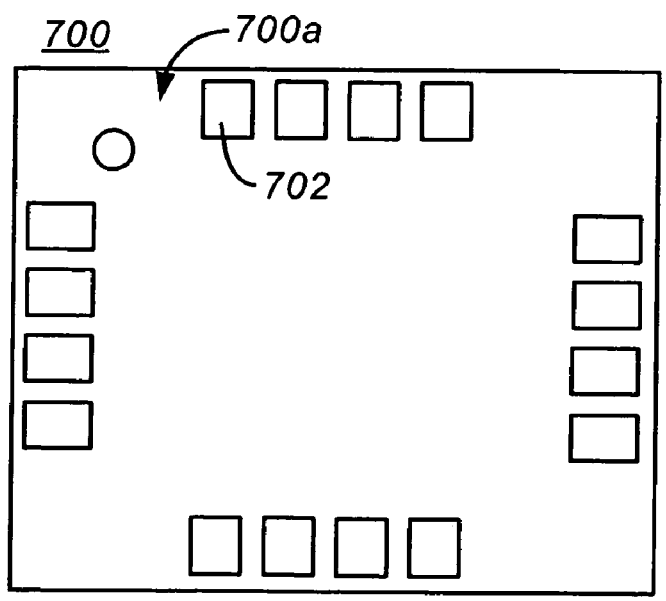
FIG. 7 shows an underside plan view of another alternative embodiment of a package fabricated in accordance with the present invention.

In accordance with embodiments of the present invention, however, a package having a non-exposed diepad can be fabricated by electrochemical deposition on an underlying substrate. FIG. 7 shows a simplified plan view of such a QFN package 700, wherein pins/lead posts 702 are exposed on underside surface 700a, but the diepad is not.

Figure 7A:
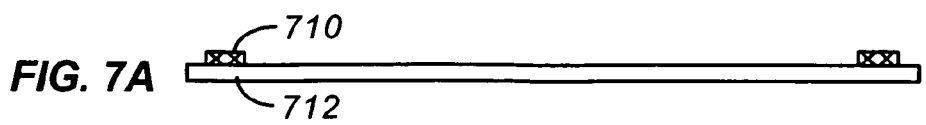
FIGS. 7A–H show simplified cross-sectional views of one embodiment of a process in accordance with the present invention for fabricating the package shown in FIG. 7.

FIGS. 7A–H show simplified cross-sectional views of one embodiment of a process for fabricating the package shown in FIG. 7. In FIG. 7A, a first silver layer 710 is selectively formed by masked electrode position over an underlying metal substrate 712. In this step, Ag is formed only in regions corresponding to the position of exposed lead posts or pins.

Figure 7B:
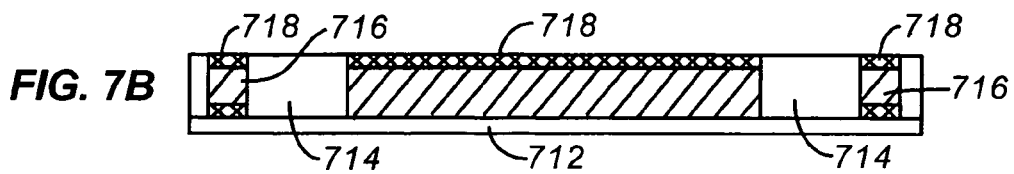

In FIG. 7B, a positive photoresist mask 714 is patterned over substrate 712, such that exposed regions correspond to existing Ag layer, and exposed regions correspond to the expected outline of the diepad. Also shown in FIG. 7B, a first Cu layer 716 is formed within the exposed regions 715. Further shown in FIG. 7B, Au/Pd/Ni layer 718 is also deposited within regions exposed by positive photoresist mask 714. As described in detail below, the copper deposited in exposed region during this step is sacrificial, and will later be removed by etching to the Ag/Pd/Ni layer 718, which serves as an etch stop.

Figure 7C:
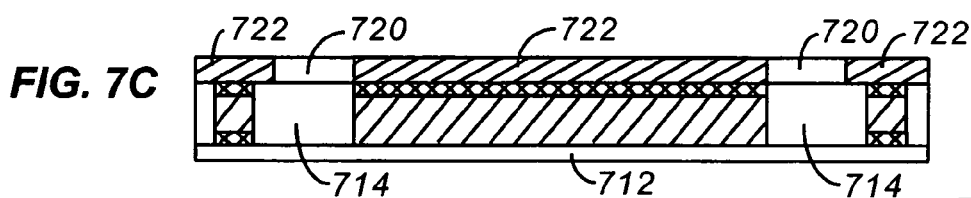

In FIG. 7C, a negative photoresist mask 720 is patterned over positive photoresist mask 714. Also shown in FIG. 7C, a second Cu layer 722 is deposited by electroplating in regions by negative photoresist mask 720.

Figure 7D:
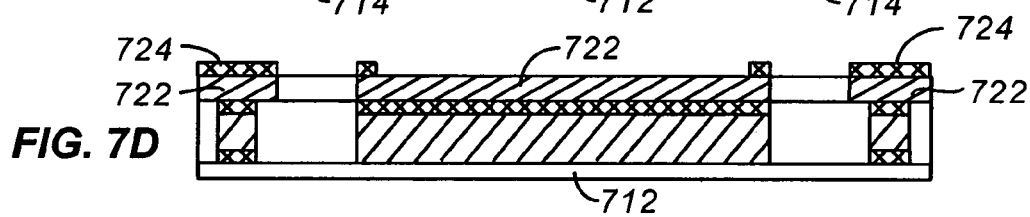
Figure 7E:
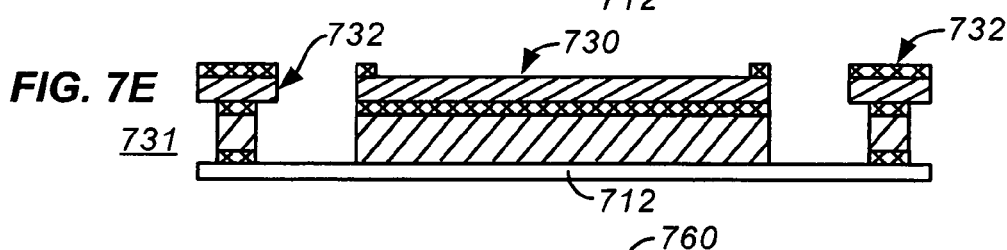

FIG. 7D shows formation of a second silver layer 724 by masked electrodeposition over second Cu layer 722. FIG. 7E shows the removal of the photoresist masks to define lead frame 731 comprising diepad 752 and separate lead posts/pins 732, supported on underlying substrate 712.

Figure 7F:
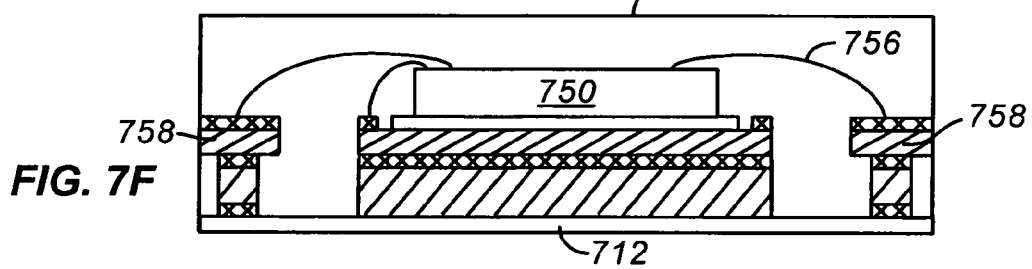

FIG. 7F shows the subsequent package fabrication steps of attaching die 750 to diepad 752, and attaching bondwires 756 between die 750 and diepad 752 and pins 758. The die/lead frame combination is then enclosed within plastic encapsulant 760.

Figure 7G:
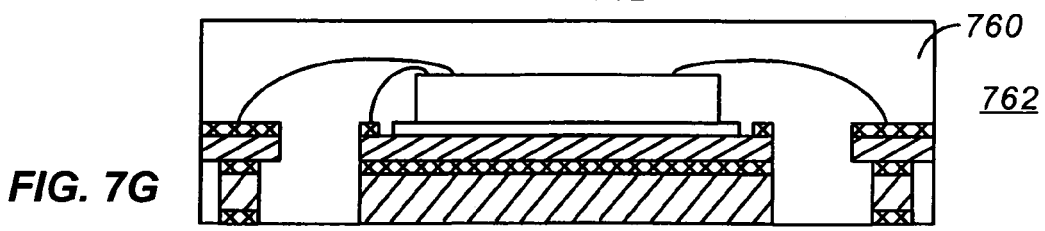

FIG. 7G shows removal of the encapsulated package 762 from the underlying substrate by chemical exposure.

Figure 7H:
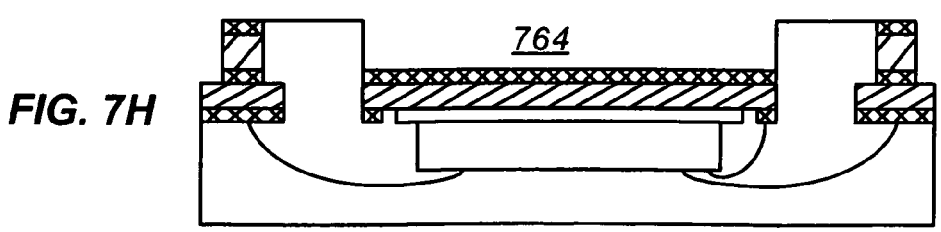

FIG. 7H shows subsequent inversion of the encapsulated package 762, followed by etching of exposed Cu material to create cavity 764 in the underside of the package. Ag/Pd/Ni layer 718 serves as an etch stop during this process.

In subsequent fabrication steps (not shown), cavity 764 is filled in with additional plastic material. During this second molding process, the additional plastic material may also cover the exposed pins/lead posts. In such case, the pins/lead posts can be re-exposed by chemical-mechanical planarization of the package underside.

Figure 9A:
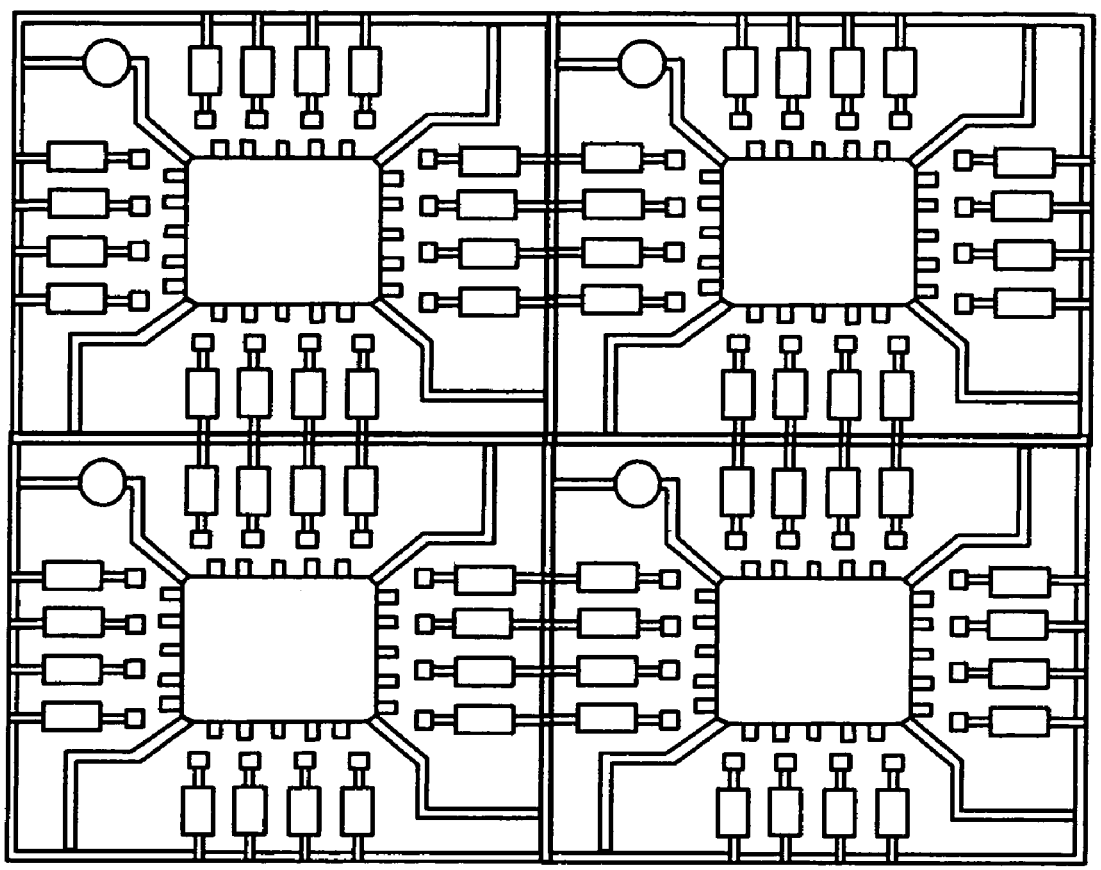
FIG. 9A shows a plan view of a matrix of lead frame designs in accordance with one embodiment of the present invention, secured within a metal frame.
Figure 9B:
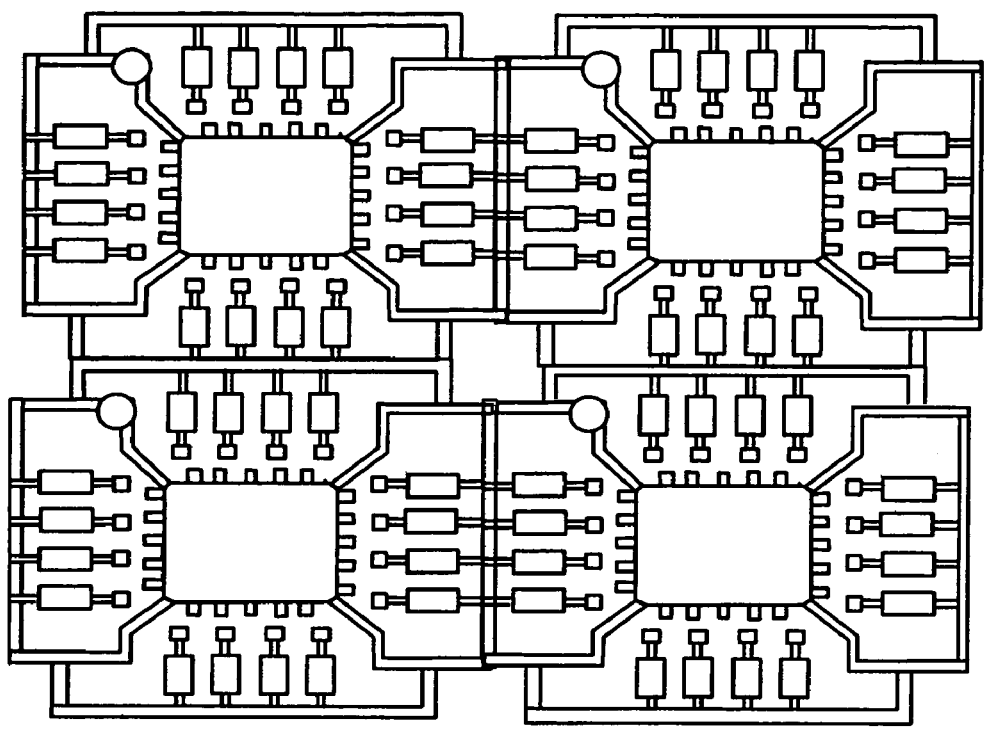
FIG. 9B shows a plan view of a matrix of lead frame designs in accordance with another alternative embodiment of the present invention.
Figure 9C:
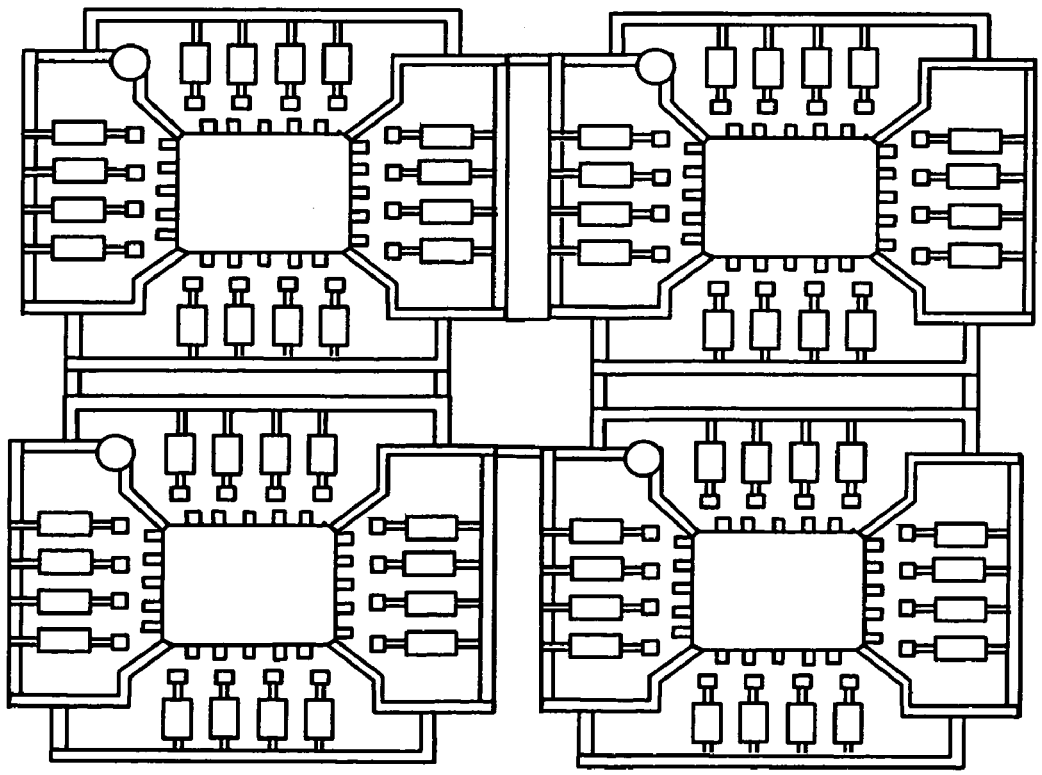
FIG. 9C shows a plan view of a matrix of lead frame designs in accordance with another alternative embodiment of the present invention.

As previously described in connection with the first embodiment, raised features may formed by electroplating additional Cu material over an existing Cu roll. This Cu roll may be patterned with holes by etching or punching to define a matrix of proto-diepad and pin regions secured to the surrounding metal frame by tabs and tie-bars. However, embodiments in accordance with the present invention are not limited to fabricating any particular matrix of framed structures. FIGS. 9A–C show plan views of different matrices of lead frame designs which may be fabricated utilizing the present invention.

While the above referenced discussion has focused upon electroplating techniques to form continued pin structures conducive to physical retention within the plastic package, the present invention is not limited to forming this type of raised feature. Alternative embodiments in accordance with the present invention utilize deposition by electroplating to fabricate other raised features.

Figure 8:
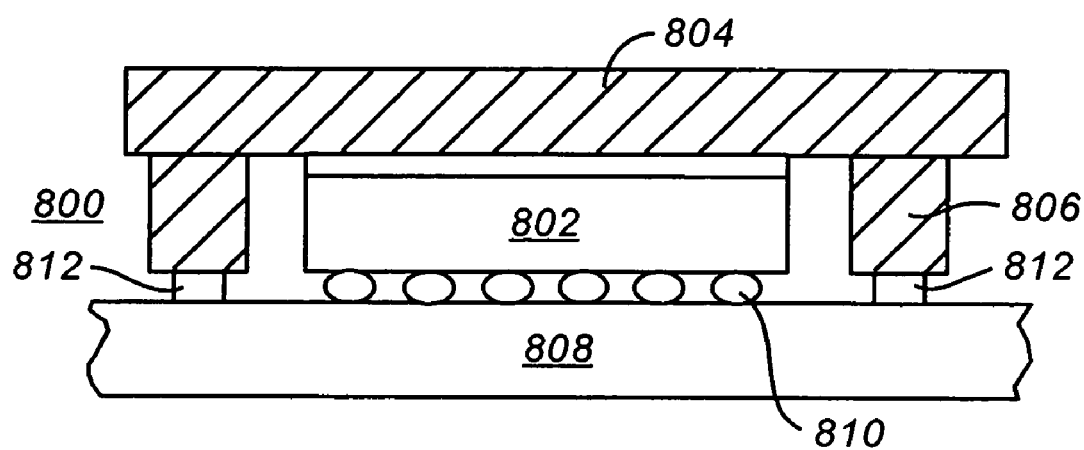
FIG. 8 shows a cross-sectional view of another embodiment of a package fabricated in accordance with the present invention.

For example, FIG. 8 shows a cross-sectional view of one alternative embodiment of a package in accordance with the present invention. Power ball grid away (BGA) package 800 of FIG. 8 features die 802 secured to the underside of diepad 804 and between projecting metal pin portions 806. Package 800 is secured to PC board 808 by solder balls 810. Unlike the QFN and other package types discussed herein, the pins of the power BGA package are not encapsulated within a plastic material.

Studs 812 protruding from pins 806 make contact with the underlying traces on the PC board. The presence of studs 806 raises the lower surface of the package off the surface of the PC board, thereby allowing solder balls 810 to maintain their rounded shape when the package is secured to the PC board. The Cu studs are about 6–10 mils in diameter and are covered by Ni/Pd/Au or Ni/Ag deposited layers for solderability and protection of the solderable layer (Ni).

Maintaining the rounded shape of the solder balls is beneficial by allowing removal and reworking of soldered packages. The raised stud features of the power BGA package shown in FIG. 8 may be selectively deposited on the exposed pins utilizing masked electroplating techniques according to the present invention.

Figure 11:
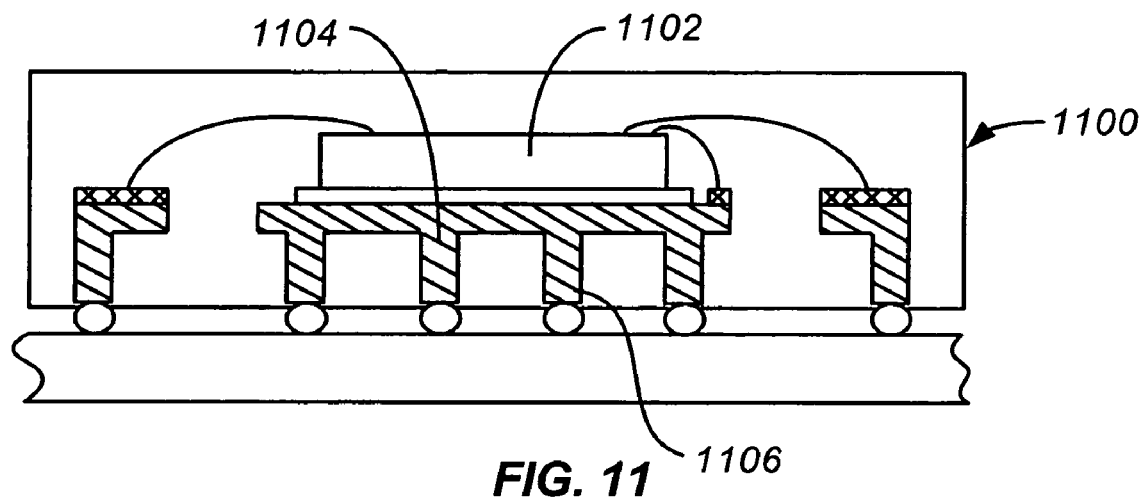
FIG. 11 shows a cross-sectional view of another embodiment of a package fabricated in accordance with the present invention.

Embodiments in accordance with the present invention are also suited for fabricating QFN packages which utilize aspects of the ball grid array architecture shown in FIG. 8. For example, FIG. 11 shows a simplified cross-sectional view of another alternative embodiment of a package fabricated in accordance with the present invention.

Package 1100 comprises die 1102 supported on lead frame 1104 having raised projections 1106 on the underside. The package 1100 of FIG. 11 thus allows only selected portions of the diepad 1104 to be exposed on the underside of the package. The package type shown in FIG. 11 allows solder balls of the same size to be used to attach all exposed pins and die pads, facilitating manufacture in a manner compatible with conventional BGA-type manufacturing processes.

Figure 12:
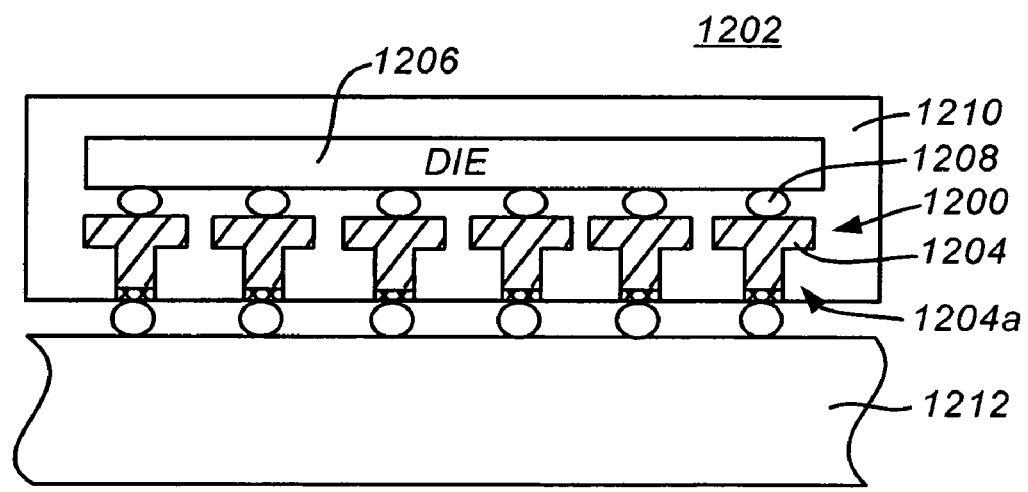
FIG. 12 shows a cross-sectional view of an alternative embodiment of a package in accordance with the present invention.

FIG. 12 shows a simplified cross-sectional view of yet another alternative embodiment of a package in accordance with the present invention. Diepad 1200 of package 1202 comprises a number of individual, non-integral pins 1204 in electrical communication with corresponding contacts on the underside of die 1206 through internal solder connections 1208. Pins 1204 are securely embedded within plastic encapsulant 1210 by virtue of the presence of raised portions 1204*a* selectively deposited utilizing electroplating techniques according to embodiments of the present invention. Pins 1204*a* are in electrical communication with, and physically supported by, PC board 1212.

Package 1202 offers a small, thin housing for integrated circuits (ICs) featuring multiple pads. Such a package, commonly referred to as a Chip Scale Package (CSP), may be fabricated using solder ball connections between IC chip pads and pins formed by electrodeposition in accordance with embodiments of the present invention. Such CSP packages can be attached to the PC board using solder balls or surface mount die attach processes.

Figure 13A:
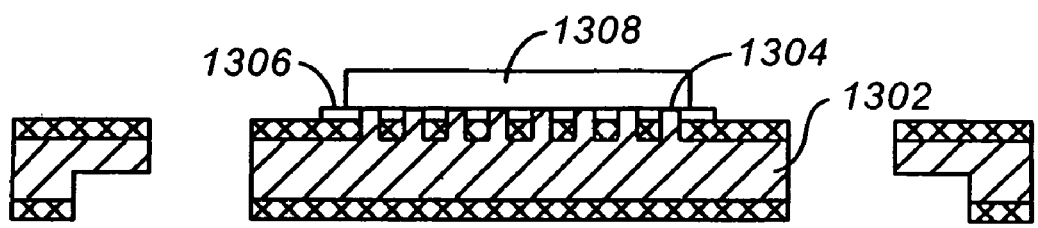
FIG. 13A shows a cross-sectional view of another alternative embodiment of a QFN package fabricated in accordance with the present invention.
Figure 13B:
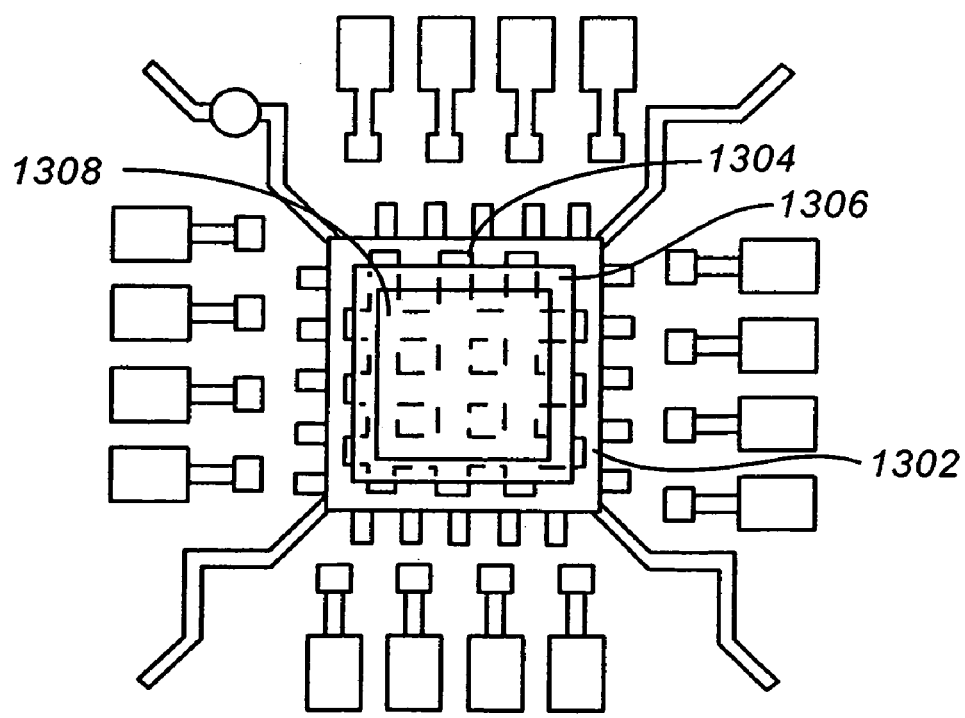
FIG. 13B shows a plan view of the package shown in FIG. 13A.

FIG. 13A shows a cross-sectional view, and FIG. 13B shows an underside plan view, of yet another embodiment of the QFN package design that may be fabricated in accordance with the present invention. Package 1300 of FIG. 13 is similar to that shown in FIGS. 3A–3EA, except that the top surface of the diepad portion 1302 now bears raised waffle pattern 1304 having a thickness of between about 1.5–2 mil and a diameter of between about 4–10 mils. The exposed surfaces of these raised waffle patterns may, but need not, be covered with Ag/Ni or Au/Pd/Ni electroplated films.

Raised waffle pattern 1304 serves to compartmentalize conducting adhesive 1306 during spreading as die 1308 being placed on the diepad. Raised waffle pattern 1304 deposited by electroplating in accordance with embodiments of the present invention, can serve to cause the adhesive to be of relatively uniform thickness, ensuring the level attitude of the die within the plastic encapsulation.

While the embodiment shown and discussed in connection with FIGS. 13A–B utilize raised features in the form of a continuous waffle pattern, embodiments in accordance with the present invention are not limited to this particular pattern. In accordance with alternative embodiments, the upper surface of a diepad could feature a non-continuous pattern of raised studs to achieve the same purpose. Such raised waffle or stud patterns created in accordance with embodiments of the present invention may be useful for QFN packages as well as other package types, including but not limited to DPAK, D2PAK, TO-220, TO-247, SOT-223, TSSOP-x, SO-x, SSOP-x, and TQFP.

While the above is a full description of the specific embodiments, various modifications, alternative constructions and equivalents may be used. Therefore, the above description and illustrations should not be taken as limiting the scope of the present invention which is defined by the appended claims.

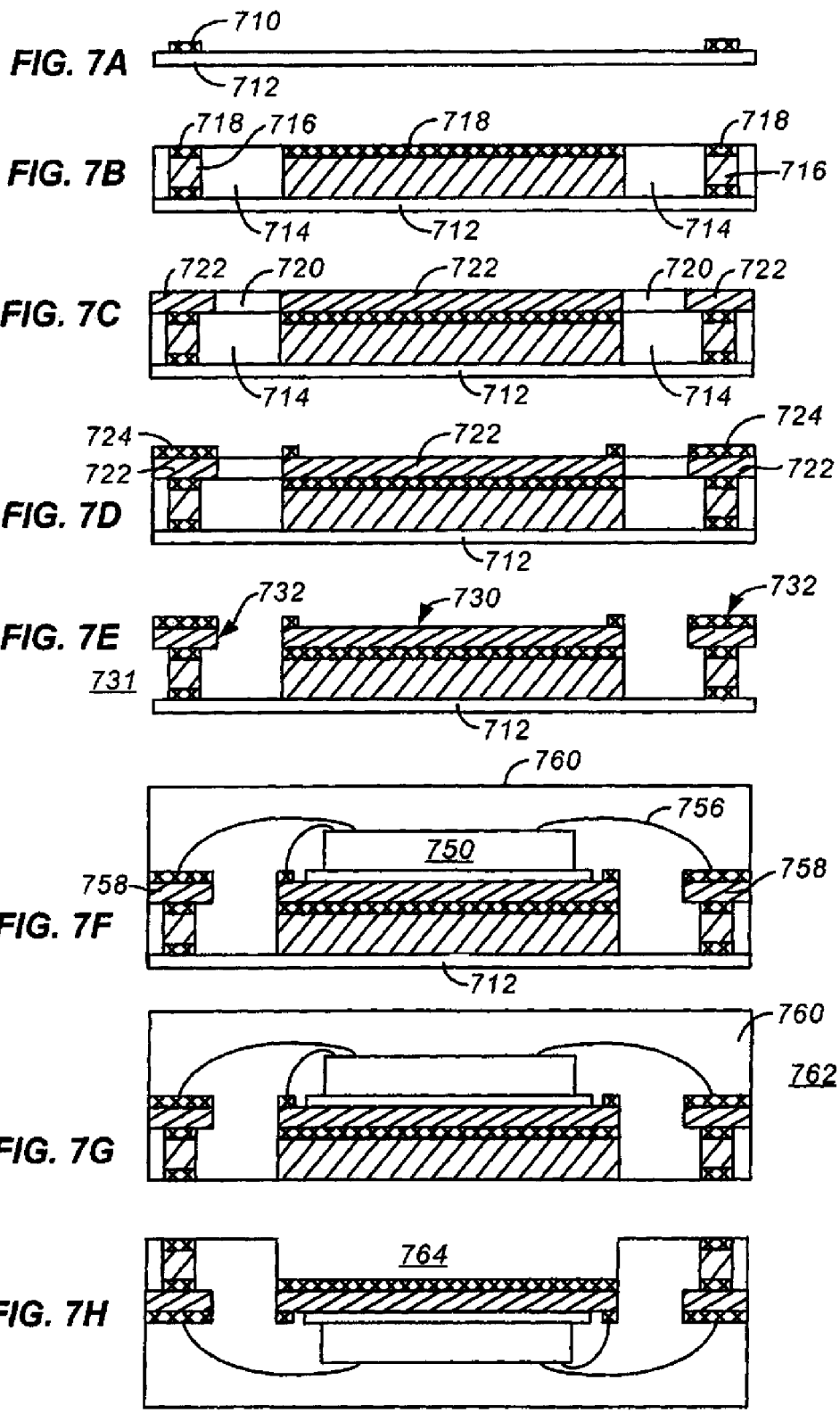

What is claimed is:

1. A method of fabricating a lead frame for a semiconductor device package, the method comprising:
   providing a first layer;
   patterning a first mask over the first layer to reveal first exposed regions;
   electroplating a first metal over the first layer in the first exposed regions;
   patterning a second mask over the first mask to reveal second exposed regions;
   electroplating a second metal over the first mask in the second exposed regions;
   removing the first and second masks; and
   encapsulating at least a portion of the first metal and the second metal within dielectric material.

2. The method of claim 1 wherein the first metal and the second metal are the same.

3. The method of claim 1 wherein:
   patterning the first mask comprises patterning a negative photoresist mask; and
   patterning the second mask comprises patterning a positive photoresist mask.

4. The method of claim 3 wherein removing the negative and positive photoresist masks defines a lead frame comprising a diepad portion and a pin portion, the method further comprising:
   encapsulating the lead frame within a plastic package body; and
   separating the first metal from the first layer, wherein the first exposed regions correspond to a pin portion exposed on a surface of the package body.

5. The method of claim 4 wherein the lead frame is encapsulated within a cell of a mold, such that individual packages are singulated upon separation of the first metal from the first layer.

6. The method of claim 4 further comprising:
   forming an etch stop layer over the first metal prior to forming the second metal;
   etching a portion of the first metal revealed by separation from the first layer to form a cavity; and
   introducing additional dielectric material within the cavity.

7. The method of claim 6 wherein forming the etch stop layer comprises electroplating a metal different from the first and second metals within the first exposed regions.

8. A method of fabricating a metal lead frame, the method comprising:
   patterning a negative photoresist mask over a substrate;
   electroplating raised portions of a copper lead frame within regions exposed by the negative photoresist mask;
   patterning a positive photoresist mask over the negative photoresist mask and the raised copper portions;
   electroplating diepad and pin portions of the copper lead frame within regions exposed by the positive photoresist mask;
   removing the negative and positive photoresist masks;
   attaching a die to the diepad;
   encapsulating the die and lead frame within plastic; and
   separating the raised copper portions and the plastic from the substrate.

9. The method of claim 8 further comprising singulating the encapsulated die and lead frame from adjacent packages by sawing.

10. The method of claim 9 wherein:
    the die and lead frame are encapsulated within a cell of a surrounding mold; and
    separation of the raised copper portions and the plastic from the substrate is accomplished by chemical etching, resulting in singulation of the encapsulated die and lead frame from adjacent packages.

* * * * *

UNITED STATES PATENT AND TRADEMARK OFFICE
CERTIFICATE OF CORRECTION

PATENT NO.        : 7,122,406 B1
APPLICATION NO.  : 10/751265
DATED             : October 17, 2006
INVENTOR(S)      : Tat Keung Chan et al.

It is certified that error appears in the above-identified patent and that said Letters Patent is hereby corrected as shown below:

In the Drawings:

Replace Figure 7H, Sheet 12, with Figure 7H on the attached sheet of the formal drawings.

Signed and Sealed this

First Day of September, 2009

David J. Kappos
*Director of the United States Patent and Trademark Office*